US008872155B2

(12) United States Patent
Han et al.

(10) Patent No.: US 8,872,155 B2
(45) Date of Patent: Oct. 28, 2014

(54) NANOSTRUCTURED THIN FILM, SURFACE LIGHT SOURCE AND DISPLAY APPARATUS EMPLOYING NANOSTRUCTURED THIN FILM

(75) Inventors: Seung-hoon Han, Seoul (KR); Hong-seok Lee, Seongnam-si (KR); Moon-gyu Han, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 694 days.

(21) Appl. No.: 12/944,294

(22) Filed: Nov. 11, 2010

(65) Prior Publication Data

US 2011/0180779 A1    Jul. 28, 2011

(30) Foreign Application Priority Data

Jan. 22, 2010  (KR) .................. 10-2010-0006051

(51) Int. Cl.
| | | |
|---|---|---|
| H01L 29/06 | (2006.01) | |
| H01L 31/0328 | (2006.01) | |
| H01L 31/0336 | (2006.01) | |
| H01L 31/072 | (2012.01) | |
| H01L 31/109 | (2006.01) | |
| B82Y 20/00 | (2011.01) | |
| H01L 33/06 | (2010.01) | |

(52) U.S. Cl.
CPC ............... *B82Y 20/00* (2013.01); *H01L 33/06* (2013.01)
USPC ................. 257/13; 257/79; 257/E33.005

(58) Field of Classification Search
USPC ............................................ 257/79, E33.005
See application file for complete search history.

(56) References Cited

U.S. PATENT DOCUMENTS

| | | | |
|---|---|---|---|
| 7,592,632 B2 | 9/2009 | Takagi | |
| 7,738,752 B2 * | 6/2010 | Yamagiwa et al. | ............. 385/39 |
| 2004/0227694 A1 | 11/2004 | Sun et al. | |
| 2005/0063427 A1 | 3/2005 | Solajcic et al. | |
| 2010/0091224 A1 * | 4/2010 | Cho et al. | ....................... 349/105 |

FOREIGN PATENT DOCUMENTS

KR    10-2007-0112866    11/2007

* cited by examiner

*Primary Examiner* — Thien F Tran
(74) *Attorney, Agent, or Firm* — NSIP Law (57) ABSTRACT

A nanostructured thin film used in a surface light source, including a dielectric layer, and nanostructures that are arranged periodically in the dielectric layer, wherein light emitted from the nanostructured thin film has directivity according to the nanostrucures.

20 Claims, 6 Drawing Sheets

NANOSTRUCTURED THIN FILM, SURFACE LIGHT SOURCE AND DISPLAY APPARATUS EMPLOYING NANOSTRUCTURED THIN FILM

CROSS-REFERENCE TO RELATED APPLICATIONS

This application claims the benefit under 35 U.S.C. §119 (a) of Korean Patent Application No. 10-2010-0006051, filed on Jan. 22, 2010, in the Korean Intellectual Property Office, the disclosure of which is incorporated herein in its entirety by reference.

BACKGROUND

1. Field

The following description relates to nanostructured thin films, surface light sources and display apparatuses employing the nanostructured thin films.

2. Description of the Related Art

A surface light source is a light source which emits light from a surface thereof. Since a light-receiving type displaying device such as a liquid crystal display (LCD) may not itself emit light to form an image, a separate surface light source referred to as a backlight unit is required. The backlight unit has been manufactured using a plurality of line light sources such as cold cathode fluorescent lamps (CCFLs), or a plurality of dot light sources such as light emitting diodes (LEDs). Generally, the backlight unit using the CCFLs or the LEDs has high manufacturing costs and high power consumption, problems which may be overcome by using a surface light source as the backlight unit. In addition, recently, research has been conducted into a surface light source having good directivity, to be used in a three-dimensional stereoscopic image display apparatus.

SUMMARY

Example embodiments provide a nanostructured thin film in which nanostructures are arranged periodically in a dielectric layer such that light emitted from the dielectric layer has directivity according to the nanostructures.

Additional aspects will be set forth in part in the description which follows and, in part, will be apparent from the description, or may be learned by practice of the example embodiments.

The foregoing and/or other aspects may be achieved by providing a nanostructured thin film to be used in a surface light source, the nanostructured film including a dielectric layer, and nanostructures that are arranged on the dielectric layer at periodic intervals, wherein light emitted from the dielectric layer has directivity according to the nanostructures.

The nanostructures may be each formed of a metal and/or a dielectric material having different permittivity from a material used to form the dielectric layer.

The dielectric layer may include an active thin film layer or material to create the light.

The active thin film layer may include p-n junction semiconductor layers, an organic compound layer, a quantum dot layer, a quantum well layer, phosphors, dyes, or any combination thereof.

The directivity of the light may be adjusted by changing a material of the dielectric layer, optical characteristic of the dielectric layer, a material, shape, period, and optical characteristic of each of the nanostructures, or any combination thereof.

Each of the periodic intervals of the nanostructures may be smaller than a wavelength of the light.

Each of the nanostructures may have a nanoparticle shape, a nanorod shape, a nanoplate shape, a nanocylindrical shape, or a nanolattice shape.

Each of the nanostructures may include a composite structure comprising a plurality of metals and/or dielectric materials which has different permittivity from a material used to form the dielectric layer.

A first region in which the nanostructures may be arranged, and a second region formed of a different material from the dielectric layer and/or in which the nanostructures are alternately arranged may be provided.

The second region may include a plurality of regions formed of different materials.

The nanostructured thin film may further include a passive or active optical element.

The nanostructured thin film may emit at least one of light beams exhibiting red, green, and/or blue colors.

At least two thin films to emit the red, green, and/or blue colors may be sequentially arranged.

According to another aspect, a three-dimensional stereoscopic image display apparatus may include the nanostructured thin film.

According to another aspect of the present invention, a surface light source may include a first multilayer in which a plurality of the nanostructured thin films are stacked, an active thin film layer disposed on the first multilayer, and a second multilayer disposed on the active thin film layer, wherein a smaller number of layers are stacked than in the first multilayer, wherein light is created by the active thin film layer, and the light created by the active thin film layer is reflected on the first multilayer, and is emitted from the second multilayer, and has directivity according to the nanostructures of the second multilayer.

The active thin film layer may include p-n junction semiconductor layers, an organic compound layer, a quantum dot layer, a quantum well layer, a phosphor layer, a dye layer, or any combination thereof.

The surface light source may further include a passive or active optical element.

The surface light source may emit at least one of light beams exhibiting red, green, and/or blue colors.

At least two thin films to emit the red, green, and/or blue colors may be sequentially arranged.

According to another aspect of the present invention, a three-dimensional stereoscopic image display apparatus may include the above surface light source.

BRIEF DESCRIPTION OF THE DRAWINGS

These and/or other aspects will become apparent and more readily appreciated from the following description of various example embodiments, taken in conjunction with the accompanying drawings of which.

DETAILED DESCRIPTION

Various example embodiments will now be described more fully with reference to the accompanying drawings in which various aspects of some example embodiments are illustrated.

Detailed illustrative example embodiments are disclosed herein. However, specific structural and functional details disclosed herein are merely representative for purposes of describing various example embodiments. Various aspects of these embodiments, however, may be embodied in many alternate forms and should not be construed as limited to only the example embodiments set forth herein.

Accordingly, while various example embodiments are capable of various modifications and alternative forms, embodiments thereof are illustrated by way of example in the drawings and will herein be described in detail. It should be understood, however, that there is no intent to limit any aspects of the example embodiments to the particular forms disclosed, but on the contrary, the discussion of example embodiments shall cover all modifications, equivalents, and alternatives falling within the scope of the invention. Like numbers refer to like elements throughout the description of the figures.

It will be understood that, although the terms first, second, etc., may be used herein to describe various elements of various example embodiments, these elements are not limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed on" another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular example embodiments being described only, and is not intended to be limiting of other various example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, operations, elements, and/or components, but do not preclude the presence or addition of one or more other features, integers, operations, elements, components, and/or groups thereof.

In the drawings, the thicknesses of layers and regions may be exaggerated for clarity. Like reference numerals in the drawings denote like elements.

Figure 1:
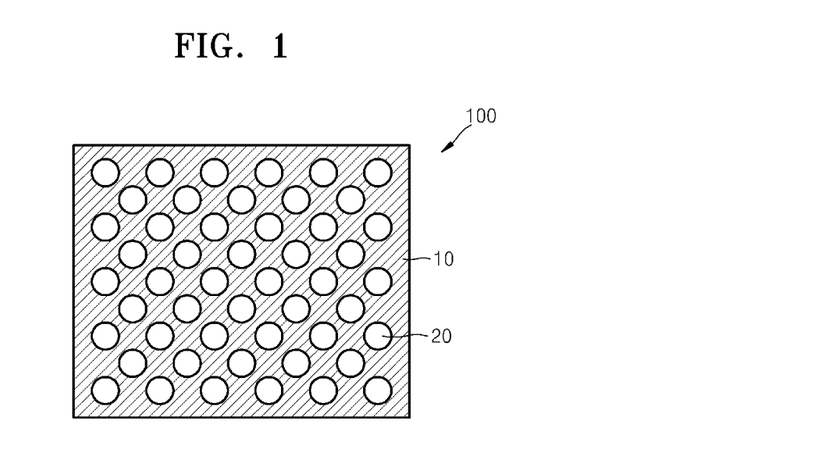
FIG. 1 is a schematic plan view illustrating a nanostructured thin film having nanostructures, to be used in a surface light emitting source, according to an example embodiment.

FIG. 1 is a schematic plan view illustrating a nanostructured thin film 100 including nanostructures 20, to be used in a surface light source, according to an example embodiment.

Referring to FIG. 1, the nanostructured thin film 100 may include a dielectric layer 10 and the nanostructures 20. The nanostructures 20 may be arranged in the dielectric layer 10 at periodic intervals. The period of the nanostructures 20 may be smaller than a wavelength of light emitted from the nanostructured thin film 100. The nanostructure 20 may be formed of a dielectric material, a metal, or the like, or any combination of such elements. The permittivity of a material of the nanostructures 20 may be different from that of the dielectric layer 10. The nanostructures 20 may include a composite structure formed of a dielectric material, a metal, or the like, for example, a core-shell nanoparticle, a nanocapsule, etc. A thickness of the dielectric layer 10 may be in the range of several nm to several tens of μm. When light emitted from a light source (not illustrated) is transmitted through the nanostructured thin film 100, since the light has a very small wave vector component along a direction parallel to a surface of the nanostructured thin film 100, the light may have directivity orthogonal to the surface of the nanostructured thin film 100. That is, the light transmitted through the nanostructured thin film 100 may have a wave vector component that converges to zero along a direction parallel to the surface of the nanostructured thin film 100. Accordingly, the light emitted from the nanostructured thin film 100 may have directivity orthogonal to the surface of the nanostructured thin film 100. In addition, an emitting angle and an emitting angle range of directional light transmitted through the nanostructured thin film 100 may be adjusted by changing the material or optical characteristic of the dielectric layer 10, or the material, shape, interval, optical characteristic, etc., of the nanostructures 20. The optical characteristics may include, for example, permittivity, permeability, refractive index, gain, and so on. The dielectric layer 10 may include an active thin film layer used in creating light. The nanostructures 20 may create light, like the active thin film layer. When the dielectric layer 10 includes the active thin film layer or materials, since the active thin film layer creates light, a separate light source may not be provided. The active thin film layer or materials may include, for example, at least one selected from the group consisting of p-n junction semiconductor layers, an organic compound layer, a quantum dot layer, a quantum well layer, phosphors, and dyes. The active thin film layer or materials may also include different combinations of two or more of the selections from this group, as well as elements not listed in the group. The p-n junction semiconductor layers may be used, for example, in a light emitting diode (LED), the organic compound layer may be used, for example, in an organic light emitting diode (OLED), and the phosphors may be used, for example, in a plasma display panel (PDP).

Figure 2:
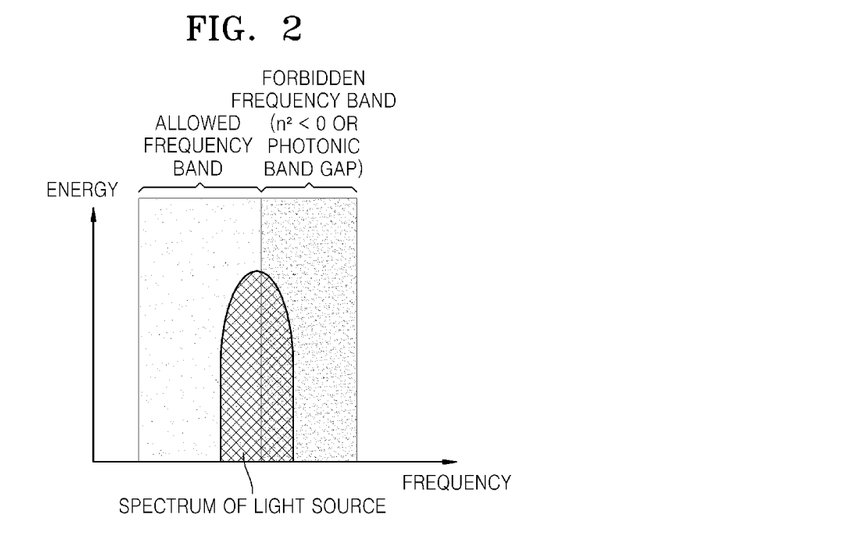
FIG. 2 is a graph illustrating a frequency characteristic of light emitted from a nanostructured thin film having nanostructures.

FIG. 2 is a graph illustrating a frequency characteristic of light emitted from the nanostructured thin film 100 having the nanostructures 20.

Referring to FIG. 2, light may be emitted from the nanostructured thin film 100 in an allowed frequency band, but light may not be emitted from the nanostructured thin film 100 in a forbidden frequency band. For example, when different dielectric materials are arranged periodically, a photonic band gap may be formed in an energy spectrum of an electromagnetic wave to create a forbidden frequency band in which light is not transmitted in a predetermined wavelength (or frequency) band. For example, in a case in which the square of the refractive index (n) is smaller than 0 or in the photonic band gap, a forbidden frequency band may be formed. As illustrated in FIG. 2, an emission spectrum of the light source extends over both the allowed and forbidden frequency bands. Generally, the spectrum of the light source may be variously located between the allowed and forbidden frequency bands. In the emission spectrum, light emitted from the light source may be transmitted through and emitted from the nanostructured thin film 100 in a frequency band in which the spectrum of the light source overlaps the allowed frequency band. In a case of the nanostructured thin film 100 including the active thin film layer, the nanostructured thin film 100 may be the light source, and light may be emitted from the nanostructured thin film 100 in a frequency band in which the spectrum of the nanostructured thin film 100 and the allowed frequency band overlap each other. In addition, the frequency and directivity of the light emitted from the nanostructured thin film 100 may be adjusted by altering a region in which the spectrum of the light source and the allowed frequency band overlap each other.

FIGS. 3A through 3D are perspective views illustrating nanostructures 40, 41, 43, and 45 having various shapes and various periods at which the nanostructures 40, 41, 43, and 45 are arranged on a thin film 100 to be used in a surface light source, according to various example embodiments.

Figure 3A:
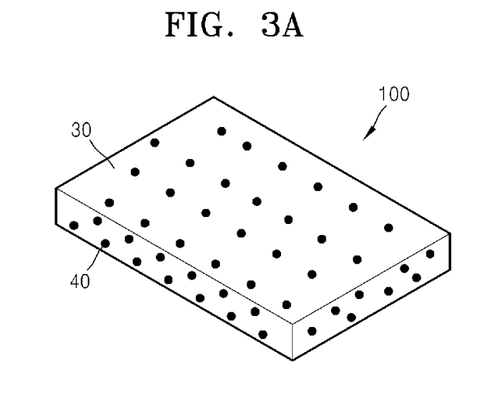
FIGS. 3A through 3D are perspective views illustrating nanostructures having various shapes and various intervals at which the nanostructures are arranged on a thin film to be used in a surface light source, according to various example embodiments.
Figure 3B:
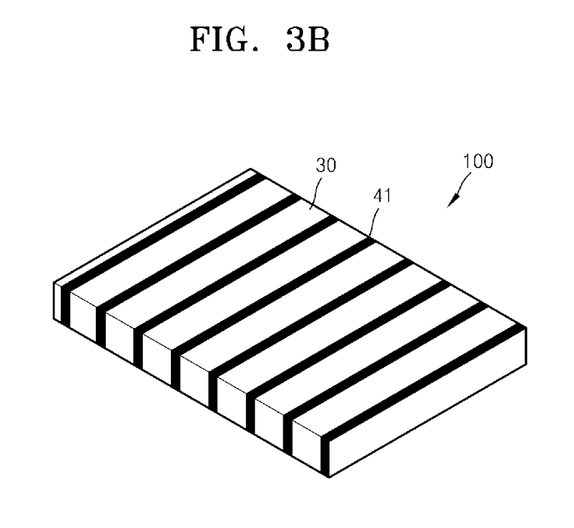
Figure 3C:
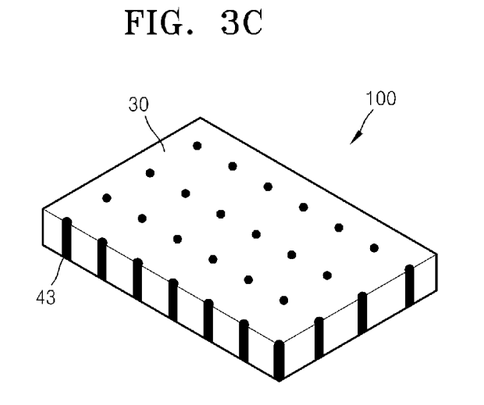
Figure 3D:
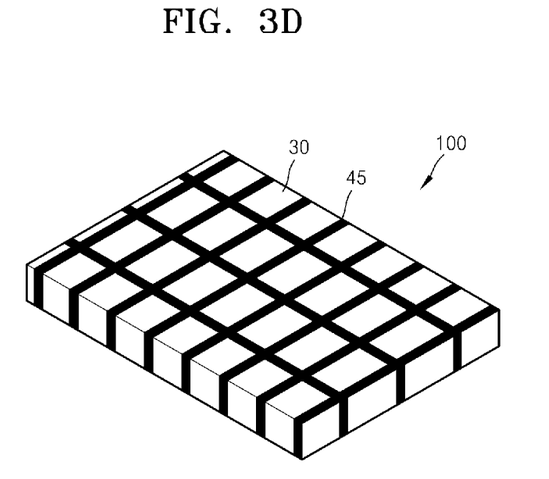

The nanostructures 40, 41, 43, or 45 included in a dielectric layer 30 may be arranged having certain periods. In FIG. 3A, the nanostructures 40, which have nanoparticle shapes, are arranged in the dielectric layer 30. The nanostructures 40, which have the nanoparticle shapes, are arranged at periodic intervals and over three-dimensional space. The nanostructures 40, which have the nanoparticle shapes, may be arranged three-dimensionally while maintaining a regular size of the nanostructure 40. In FIG. 3B, the nanostructures 41, which have nanorod or plate shapes, are arranged in the dielectric layer 30. The nanostructures 41, which have nanorod or plate shapes, are arranged periodically and in parallel to a horizontal direction. Although not illustrated, the nanostructures 41, which have nanorod or plate shapes, may be arranged in parallel to a vertical direction relative to the illustrated horizontal direction. In FIG. 3C, the nanostructures 43, which have cylinder shapes, may be arranged in the dielectric layer 30 periodically. In FIG. 3D, the nanostructures 45, which have nanolattice shapes, may be arranged in the dielectric layer 30 periodically. Although not illustrated, the nanostructures 40, 41, 43, or 45 may include a composite structure formed of a dielectric material, metal, or the like, for example, a core-shell nanoparticle or a nanocapsule. The nanostructures 40, 41, 43, or 45 may also include various combinations of such materials. Shapes of the nanostructures 40, 41, 43, and 45 illustrated in FIGS. 3A through 3D are merely examples, and the shapes of the nanostructures 40, 41, 43, or 45 are not limited thereto. The nanostructures 40, 41, 43, and 45 may be formed using a nano-imprinting method, a self-assembly method, a phase separation method, or the like, or any combination of such methods.

Figure 4:
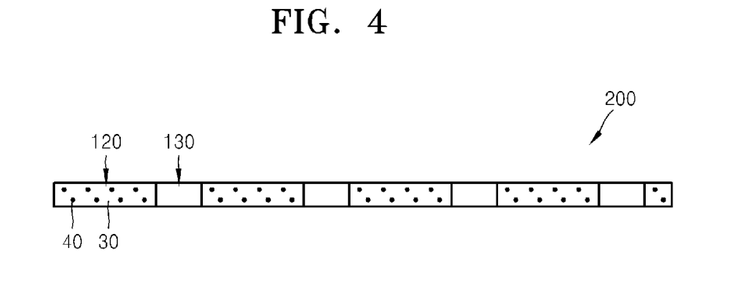
FIG. 4 is a schematic cross-sectional view illustrating a nanostructured thin film having nanostructures, to be used in a surface light emitting source, according to another example embodiment.

FIG. 4 is a schematic cross-sectional view illustrating a nanostructured thin film 200 including nanostructures 40, to be used in a surface light source, according to another example embodiment.

Referring to FIG. 4, a first region 120 and a second region 130 are alternately arranged in the nanostructured thin film 200 including the nanostructures 40. The first region 120 and the second region 130 may be arranged at periodic intervals. The first region 120 may include the dielectric layer 30 and the nanostructures 40 included in the dielectric layer 30. The nanostructures 40 may be arranged periodically and in various shapes. The second region 130 may include the same or similar dielectric layer and nanostructures as the dielectric layer 30 and the nanostructures 40 of the first region 120, but the shapes and composites provided in the second region 130 may be different to the shapes and composites provided in the first region 120. The second region 130 may be formed of a different material from that of the dielectric layer 30 or the nanostructures 40. That is, a material used to form the second region 130 may include a dielectric material, metal, etc., having a different permittivity compared to the permittivity of a material used to form the dielectric layer 30 and the nanostructures 40 provided in the first region 120. Although not illustrated in FIG. 4, the nanostructured thin film 200 may further include a plurality of other regions that are arranged at periodic intervals. That is, the second region 130 may include a plurality of regions that are formed of different materials and/or having nanostructures of different shapes. The dielectric layer 30 may include an active thin film layer or material used in creating light. In addition, the nanostructure 40 may create light like the active thin film layer or material. The active thin film layer may include at least one selected from the group consisting of p-n junction semiconductor layers, an organic compound layer, a quantum dot layer, a quantum well layer, phosphors, and dyes, or different combinations of two or more of the selections from this group, as well as elements not listed in the group. An emitting direction and intensity distribution of light emitted from the nanostructured thin film 200 may be adjusted by changing the intervals and arrangement of the regions, or by electrically, mechanically, or thermally changing the optical characteristics of the materials of the regions. The optical characteristics may include, for example, permittivity, permeability, refractive index, gain, and so on.

Figure 5:
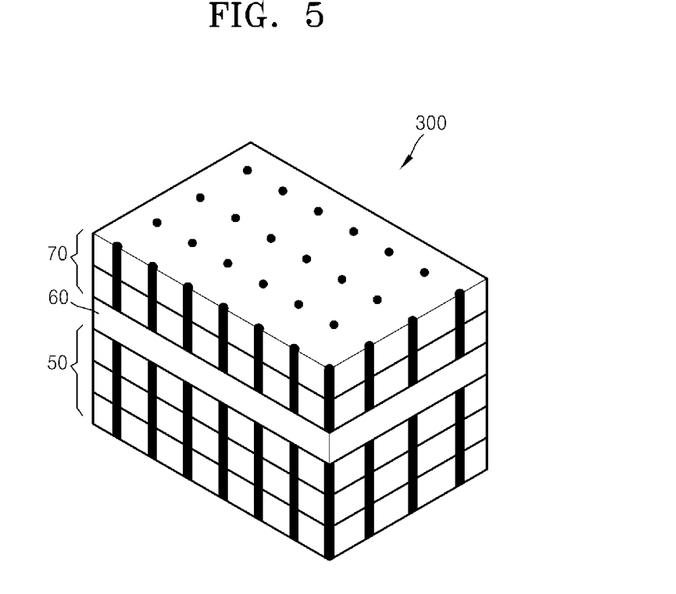
FIG. 5 is a schematic perspective view illustrating a surface light source employing nanostructured thin films, according to an example embodiment.

FIG. 5 is a schematic perspective view illustrating a surface light source 300 employing nanostructured thin films 100 and/or 200, according to an example embodiment.

Referring to FIG. 5, the surface light source 300 may include a first multilayer 50 in which the nanostructured thin films 100 and/or 200 including nanostructures are stacked in a plurality of layers, an active thin film layer 60 disposed on the first multilayer 50, and a second multilayer 70 that is disposed on the active thin film layer 60 and in which the nanostructured thin films 100 and/or 200 are stacked in a smaller number of layers than in the first multilayer 50. In the surface light source 300, light created by the active thin film layer 60 may be reflected on the first multilayer 50, may be emitted from the second multilayer 70, and may have directivity. The active thin film layer 60 may include at least one selected from the group consisting of p-n junction semiconductor layers, an organic compound layer, a quantum dot layer, a quantum well layer, a phosphor layer, and a dye layer, or may include different combinations of two or more of the selections from this group, as well as elements not listed in the group. Although not illustrated in FIG. 5, a first region in which the nanostructures are formed, and a second region formed of a different material from that of first region of the active thin film layer 60 and/or in which the nanostructures are alternately arranged at periodic intervals, may be provided in the active thin film layer 60. That is, materials used to form the first region and the second region may have different permittivity or refractive indexes.

In the surface light source 300, a photonic band gap of the first multilayer 50 formed by a photonic crystal may function as a cavity mirror. That is, light created by the active thin film layer 60 may be reflected by the first multilayer 50 and may be transmitted through the second multilayer 70 by using the photonic band gap. The photonic crystal refers to an artificial crystal that is formed by arranging materials having different permittivity at periodic intervals so as to form the photonic band gap in an energy spectrum of an electromagnetic wave. When light is incident on the photonic crystal, light of most wavelengths may be transmitted without being scattered. However, light of a predetermined wavelength (or frequency) band may not be transmitted in a reflective region, which refers to the photonic band gap. When light having a wavelength (or frequency) belonging to the photonic band gap is incident on the photonic crystal, the light may be reflected by the photonic crystal rather than being transmitted through the photonic crystal. In order to adjust the photonic band gap, photonic crystal patterns may be variously formed. The photonic crystal patterns may be formed using, for example, a holographic method, a chemical etching method, a self-assembly method, or the like, or any combination of these and/or other methods.

Only a cavity mode having a very small wave vector component along a direction parallel to a surface of the second multilayer 70 may exist in light emitted from the second multilayer 70. The light emitted from the second multilayer 70 may have a wave vector component that converges to zero along a direction parallel to the surface of the second multilayer 70. That is, light may be emitted in a direction orthogonal to the surface of the second multilayer 70.

Figure 6A:
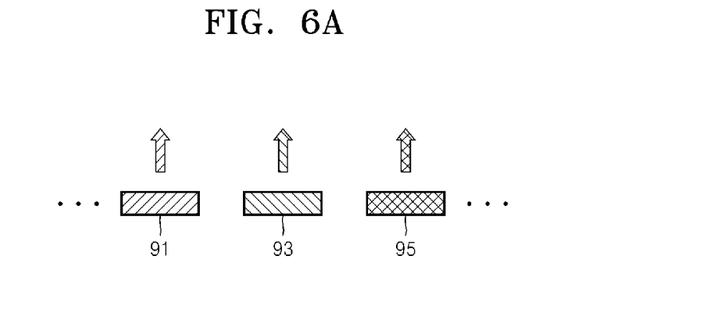
FIGS. 6A and 6B are cross-sectional views illustrating nanostructured thin films having nanostructures, to be used in surface light sources, according to various example embodiments.
Figure 6B:
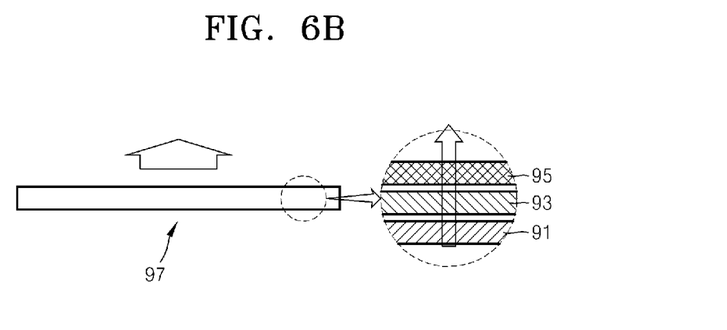

FIGS. 6A and 6B are cross-sectional views illustrating nanostructured thin films including nanostructures, to be used in surface light sources, according to various example embodiments.

Referring to FIG. 6A, the nanostructured thin film may include a plurality of thin films to emit light beams having different colors, for example, a first surface light source thin film 91, a second surface light source thin film 93, and a third surface light source thin film 95. In addition, the first surface light source thin film 91, the second surface light source thin film 93, and the third surface light source thin film 95 may be arranged in a horizontal direction. The first surface light source thin film 91 may be, for example, a thin film used in a red color surface light source. The second surface light source thin film 93 may be, for example, a thin film used in a green color surface light source. In addition, the third surface light source thin film 95 may be, for example, a thin film used in a blue color surface light source.

Referring to FIG. 6B, the first, second, and third surface light source thin films 91, 93, and 95 may be sequentially arranged in a direction in which light is emitted to form a nanostructured thin film 97. The first, second, and third surface light source thin films 91, 93, and 95 may have materially the same structure as the nanostructured thin film 100 described with reference to FIG. 1. By changing a material of a dielectric layer, structures, and shapes of nanostructures of the first, second, and third surface light source thin films 91, 93, and 95, surface light sources of various colors may be formed, and spectrum distribution of light emitted from the first, second, and third surface light source thin films 91, 93, and 95 may be adjusted to be very narrow like the spectrum distribution of a laser beam, or may be adjusted to be significantly wide like the spectrum distribution of light emitted from a light emitting diode (LED). The light emitted from any region of the first, second, and third surface light source thin films 91, 93, and 95 may be adjusted to have any one of a coherent characteristic, a partially coherent characteristic, and an incoherent characteristic.

A thin film used in surface light sources of various colors may be formed by combining at least two thin films selected from the first, second, and third surface light source thin films 91, 93, and 95. For example, a thin film used in a yellow color surface light source may be formed by combining a thin film used in the red color surface light source and a thin film used in the green color surface light source. In addition, a thin film used in a white color surface light source may be formed by sequentially arranging thin films used in the red color, green color, and blue color surface light sources. If the thin film used in the white color surface light source has a wide area, the thin film may be used as a backlight unit. When the first, second, and third surface light source thin films 91, 93, and 95 are the thin films used in the red color, green color, and blue color surface light sources, respectively, a single color pixel unit may be formed by arranging the first, second, and third surface light source thin films 91, 93, and 95 in parallel to each other.

Figure 7:
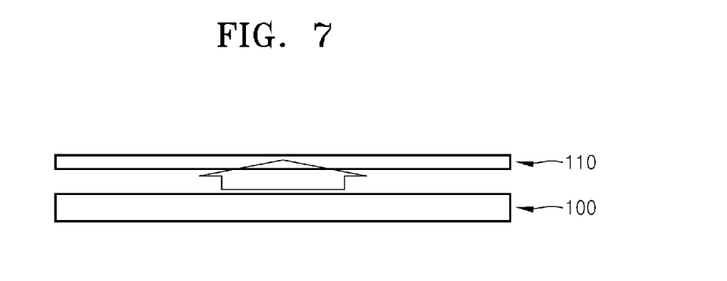
FIG. 7 illustrates a case in which a nanostrucured thin film to be used in a surface light source includes a passive or active optical element, according to an example embodiment.

FIG. 7 illustrates a case in which a nanostrucured thin film 100 used in a surface light source includes a passive or active optical element 110, according to an example embodiment.

Referring to FIG. 7, the nanostructured thin film 100 may further include at least one passive or active optical element 110. The passive or active optical element 110 may be selected from a diffuser, a polarization device, a prism device, a lens array, an acoustic optic element, a microelectromechanical system (MEMS) device, an electro-optic element, or the like, or a combination of such configurations. The nanostructured thin film 100 may further include the passive or active optical element 110, and thus an emitting angle range of directional light emitted from the nanostructured thin film 100 may be adjusted.

Figure 8:
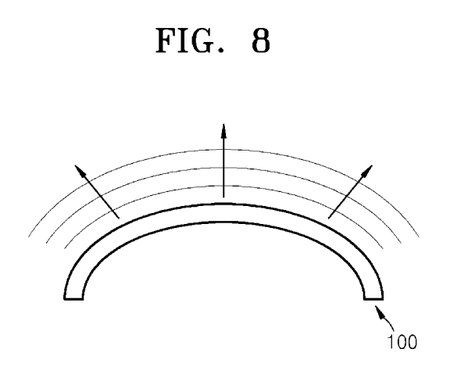
FIG. 8 illustrates the flexibility of a nanostructured thin film, according to an example embodiment.

FIG. 8 illustrates the flexibility of the nanostructured thin film 100, according to an example embodiment.

Referring to FIG. 8, since the nanostructured thin film 100 has a small thickness, the nanostructured thin film 100 may be manufactured to have various shapes, and may be flexibly changed. The nanostructured thin film 100 may be used to manufacture a tangible three-dimensional stereoscopic image display apparatus with a multiview of high resolution, high clearness, and high density by adjusting the directivity of the nanostructured thin film 100. If the nanostructured thin film 100 is used, a multiview display apparatus of high density, an integral imaging display apparatus of high resolution, a hologram television (TV) of high resolution, a high-density directional display apparatus of high clearness and high resolution, a supermultiview display apparatus, a ray saving display apparatus forming an image at a viewer's location in two or three-dimensions, and other improved devices may be manufactured. In addition, these display apparatuses may have a flat panel display that is compatible with three-dimensional display apparatuses. That is, a flat three-dimensional display apparatus may be manufactured by combining a high data addressing rate backplane and an active element. Since directivity of light emitted from the nanostructured thin film 100 may be easily adjusted by using mechanical characteristics, electrical characteristics, material, and a shape thereof, the nanostructured thin film 100 may be used to realize a display apparatus in which a flat image and a stereoscopic image may be easily switched. The nanostructured thin film 100 may be used in various lighting devices, decoration devices, sensing devices, medical endoscopes, and so on. For example, the nanostructured thin film 100 may be integrated with walls, cells, and/or windows to be used as a lighting device and/or a decoration device to show a background image. In addition, the description of the nanostructured thin film 100 may be applied to the nanostructured thin film 200 of FIG. 4 or the surface light source 300 of FIG. 5.

It should be understood that the example embodiments described therein should be considered in a descriptive sense only and not for purposes of limitation. Descriptions of features or aspects within each embodiment should typically be considered as available for other similar features or aspects in other embodiments.

A number of examples have been described above. Nevertheless, it will be understood that various modifications may be made. For example, suitable results may be achieved if the described techniques are performed in a different order and/or if components in a described system, architecture, or device are combined in a different manner and/or replaced or supplemented by other components or their equivalents. Accordingly, other implementations are within the scope of the following claims.

What is claimed is:

1. A nanostructured thin film to be used in a surface light source, comprising:
    a dielectric layer; and
    nanostructures that are arranged in the dielectric layer at periodic intervals,
    wherein light emitted from the dielectric layer has directivity according to the nanostructures, and
    wherein each of the periodic intervals of the nanostructures is smaller than a wavelength of the light.

2. The nanostructured thin film of claim 1, wherein the nanostructures are each formed of a metal and/or a dielectric material having different permittivity from a material used to form the dielectric layer.

3. The nanostructured thin film of claim 1, wherein the dielectric layer comprises an active thin film layer to create the light.

4. The nanostructured thin film of claim 3, wherein the active thin film layer comprises p-n junction semiconductor layers, an organic compound layer, a quantum dot layer, a quantum well layer, phosphors, dyes, or any combination thereof.

5. The nanostructured thin film of claim 3, further comprising a passive or active optical element.

6. The nanostructured thin film of claim 3, wherein the nanostructured thin film emits at least one of light beams exhibiting red, green, and/or blue colors.

7. The nanostructured thin film of claim 6, wherein at least two thin films to emit the red, green and/or blue colors are sequentially arranged.

8. The nanostructured thin film of claim 1, wherein the directivity of the light is adjusted by changing a material of the dielectric layer, an optical characteristic of the dielectric layer, a material, shape, interval, and optical characteristic of each of the nanostructures, or any combination thereof.

9. The nanostructured thin film of claim 1, wherein each of the nanostructures comprises a nanoparticle shape, a nanorod shape, a nanoplate shape, a nanocylindrical shape, or a nanolattice shape.

10. The nanostructured thin film of claim 1, wherein each of the nanostructures comprises a composite structure comprising a plurality of metals and/or dielectric materials which has different permittivity from a material used to form the dielectric layer.

11. The nanostructured thin film of claim 1, wherein a first region in which the nanostructures are arranged, and a second region formed of a different material from the dielectric layer and/or in which the nanostructures are alternately arranged.

12. The nanostructured thin film of claim 11, wherein the second region comprises a plurality of regions formed of different materials.

13. A three-dimensional stereoscopic image display apparatus comprising the nanostructured thin film of claim 1.

14. A surface light source comprising:
    a first multilayer in which a plurality of the nanostructured thin films of claim 1 are stacked;
    an active thin film layer disposed on the first multilayer; and
    a second multilayer disposed on the active thin film layer, wherein a smaller number of layers are stacked than in the first multilayer;
    wherein light is created by the active thin film layer; and
    the light created by the active thin film layer is reflected on the first multilayer, is emitted from the second multilayer, and has directivity according to the nanostructures of the second multilayer.

15. The surface light source of claim 14, wherein the active thin film layer comprises p-n junction semiconductor layers, an organic compound layer, a quantum dot layer, a quantum well layer, a phosphor layer, a dye layer, or any combination thereof.

16. The surface light source of claim 14, further comprising a passive or active optical element.

17. The surface light source of claim 14, wherein the surface light source emits at least one of light beams exhibiting red, green, and/or blue colors.

18. The surface light source of claim 17, wherein at least two thin films to emit the red, green, and/or blue colors are sequentially arranged.

19. A three-dimensional stereoscopic image display apparatus comprising the surface light source of claim 14.

20. The nanostructured thin film of claim 1, wherein light emitted from the dielectric layer has directivity according to the nanostructures that is orthogonal to a surface of the nanostructured thin film.

* * * * *